Jan. 29, 1963 R. C. KNECHTLI ETAL 3,076,149

COUPLED-CAVITY TRAVELING-WAVE PARAMETRIC AMPLIFIER

Filed Sept. 15, 1959 3 Sheets-Sheet 1

INVENTORS.
RONALD C. KNECHTLI,
KENNETH P. GRABOWSKI,
BY Robert G. Clay
ATTORNEY.

INVENTORS.
RONALD C. KNECHTLI,
KENNETH P. GRABOWSKI,
BY Robert D. Clay
ATTORNEY.

INVENTORS.
RONALD C. KNECHTLI,
KENNETH P. GRABOWSKI,
BY Robert D. Clay
ATTORNEY.

1

3,076,149

COUPLED-CAVITY TRAVELING-WAVE PARAMETRIC AMPLIFIER

Ronald Charles Knechtli, Torrance, and Kenneth P. Grabowski, Manhattan Beach, Calif., assignors to Hughes Aircraft Company, Culver City, Calif., a corporation of Delaware Filed Sept. 15, 1959, Ser. No. 840,114
7 Claims. (Cl. 330—4.6)

The present invention relates to a microwave amplifier and, more particularly, to a traveling wave parametric amplifier.

A number of different types of parametric amplifiers have been devised and built for special purposes. For the most part these amplifiers have been experimental in nature for the purpose of studying their feasibility or their use with existing systems on a commercial scale. A few have been developed to the point where limited use has been made environmentally as a component of a system. To date, however, these amplifiers have been inherently narrow band devices and usually require a bulky circulator as an auxiliary component. This latter requirement is established by the fact that the same terminal or port is used for both the signal input and output and separation thereof is required.

Another disadvantage of the amplifiers, referenced above, has been inferred in that such amplifiers are essentially one port devices requiring a bulky circulator to separate the input from the output, or even if operated as two port devices, the amplifiers are completely reciprocal. Such reciprocal characteristic prevents operation of the amplifiers in cascade as the combination then has an inherent tendency to oscillate or to operate over a narrow band because of strong feedback effects. Also, these amplifiers require extreme care with respect to matching of terminating components for stable operation.

Traveling wave parametric amplifiers have been proposed and reported in the literature as two port amplifiers and a few have been built. These amplifiers, however, have been limited to low frequency, U.H.F., or ultra-high frequency applications. In general, such amplifiers have been constructed with a section of coaxial line having nonlinear capacitance diodes mounted between the inner and outer conductors of the line at spaced apart positions. The impedance characteristics of the diodes are matched to those of the line; and the signal, idler, and pump energies all propagate through this line. The pump energy is generally propagated in a different mode from that of the signal and idler energies so as to be independently tunable. While this type of structure, as has been set forth, has been somewhat successful at low frequencies, the approach has not been successful at microwave frequencies for a number of reasons, among which is the fact that the electric field concentrations in the line are inherently weak and can therefore provide only minimum coupling effects at the diodes.

An object of the present invention is to provide a traveling wave parametric amplifier especially suitable for operation at microwave frequencies and which has wide bandwidth and nonreciprocal gain to inherently provide separation of the input and output signals.

A further object of the invention is to provide a wide band traveling wave parametric amplifier for operation at microwave frequencies having a plurality of amplifier cavities coupled in cascade.

Another object of the invention is to provide a traveling wave parametric amplifier having a plurality of iterative cavity structures wherein the energy propagating characteristics are independently adjustable per cavity to improve the gain and stability of the amplifier.

2

Still another object of the invention is to provide a traveling wave parametric amplifier having a plurality of iterative cavity structures loaded with nonlinear reactance elements wherein high gain per element results and power consumption is minimized.

To achieve the foregoing objects and overcome the stated disadvantages of the prior art, the present invention comprises, in brief, a wave-guiding structure supporting energies at a signal, pump, and idler frequency with a plurality of spaced-apart nonlinear reactance elements coupled to the energy of the signal and pump frequency. The waveguiding structure is suitably divided about the reactance elements to provide a series of coupled cavities so that a propagating structure is formed having alternate pass bands and stop bands. The width of the signal pass band is proportional to the strength of the direct coupling of the electromagnetic fields between adjacent cavities, and the concentration of the electric fields of the energies across the reactance elements is inversely proportional to the coupling. Thus, the reactance elements become an integral part of the respective cavities and are automatically matched to a propagating circuit formed by coupling such loaded cavities. Under these circumstances a portion of the pump energy, at each reactance element, is translated to enhance the signal energy and to provide energy at the idler frequency.

Other objects and advantages of the present invention will be apparent from the following description and claims when considered together with the accompanying drawings, in which:

Figures 1, 2:
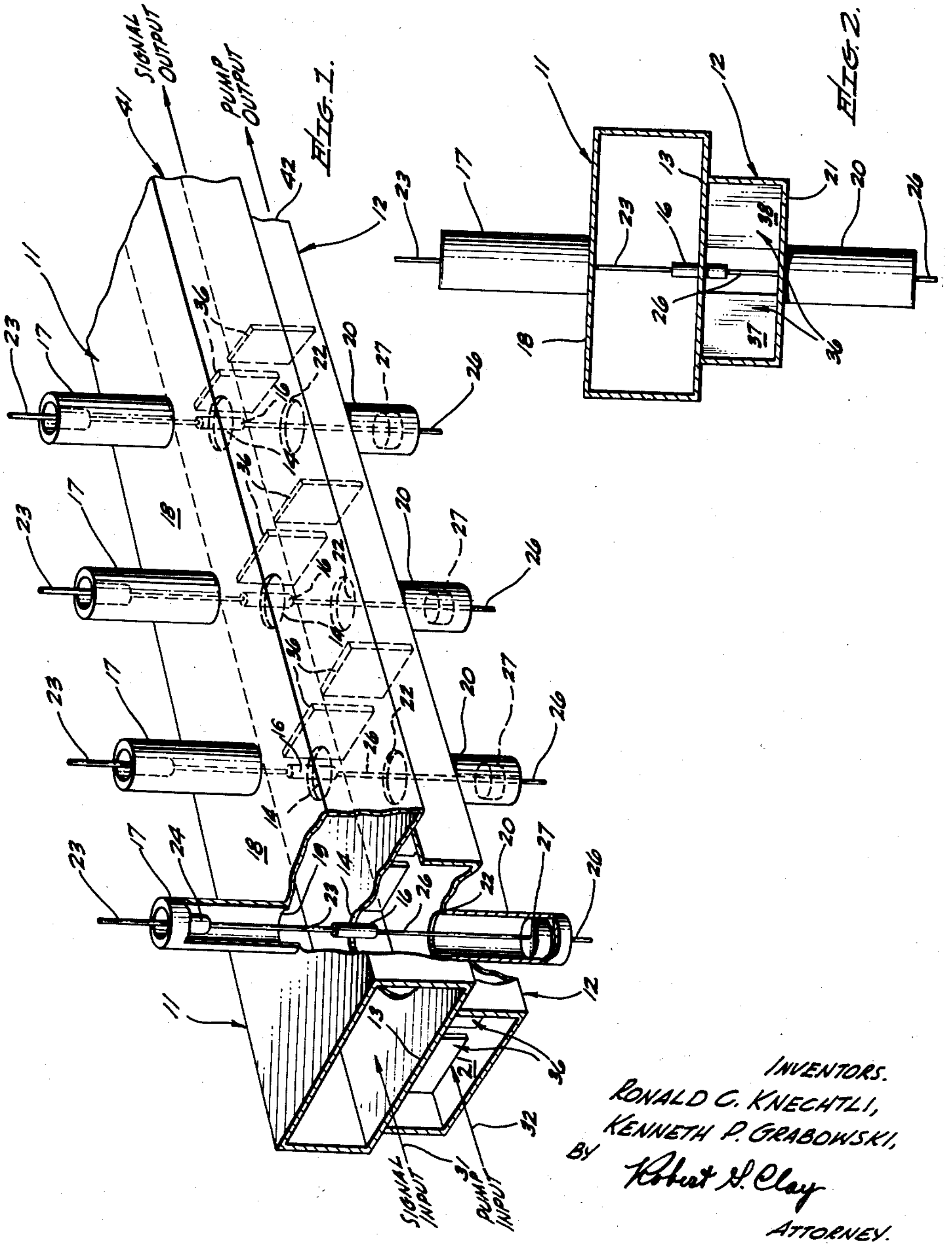
FIGURE 1 is a perspective view, partly in section, of one form of the present invention.
FIGURE 2 is an end view of the invention of FIG. 1.

Referring to the drawings in detail, FIG. 1 in particular, there is shown a first section of waveguide 11, which is illustrated by way of example as a rectangular waveguide, for propagating energy at a signal frequency, $f_s$. To propagate energy at a pump frequency, $f_p$, a second section of waveguide 12, also shown as a rectangular waveguide for illustrative purposes, is mounted to have a common broad wall 13 with the first section of waveguide 11 and to have a parallel longitudinal centerline therewith. A plurality of apertures 14, shown as four in quantity in FIG. 1 by way of example, is provided in spaced-apart relation along the longitudinal center line of the common broad wall 13. These apertures 14 are illustrated as circular in configuration, but are not limited to such configuration, and are not critical as to dimension except that sufficient space be provided for mounting a nonlinear reactance element 16 in space-insulated relation in each aperture. Suitable nonlinear reactance elements 16 may, in accordance with the present invention, be junction-type semiconductor diodes having a nonlinear capacitance characteristic.

To respectively mount the nonlinear reactance elements 16 centrally within the apertures 14, an equivalent number of waveguide stubs 17, shown as circular in cross section for example, are transversely mounted in a similar spaced-apart relation along the center line of the other broad wall 18 of the first waveguide 11 about coupling apertures 19. Similar waveguide stubs 20 are transversely mounted in spaced-apart relation along the center line of the other broad wall 21 of the second waveguide 12 about coupling apertures 22 in alignment with the stubs 17. Thus, with a first lead 23 of the nonlinear reactance element 16 extended coaxially through one stub 17 and through a movable plug 24 within the stub and with a second lead 26 extended coaxially through the aligned stub 20 and through a movable plug 27 within the stub, the element is suitably mounted with respect to the two waveguides 11 and 12. One plug 27 is of such dimension as to contact the inner wall of the stub 20 and thereby provides an effective short circuit for both direct and radio frequency currents while the other plug 24 (illustrated schematically) may be of the conventional noncontacting wavetrap type, and thereby provides an effective short circuit to only radio frequency current. This latter provision permits, in those instances where necessary, the application of a direct current bias to the nonlinear reactance elements 16 by the respective connection of the extended leads 23 and 26 to a suitable direct current supply (not shown).

In operation a source (not shown) of signal energy having the frequency, $f_s$, is coupled to one end of the first section of waveguide 11, as indicated by arrow 31 of FIG. 1, and a source (not shown) of pump energy having a frequency, $f_p$ and a higher value of power as compared to that of the signal is coupled to one end of the second section of waveguide 12, as indicated by arrow 32. The two waveguides 11 and 12 are suitably dimensioned, in a manner well-known in the microwave art, to propagate the respective energies in the dominant mode. The energies as thus propagated encounter periodic admittances because of the discontinuities established by the nonlinear reactance elements 16 together with their associated mounting components. These periodic admittances have associated pass band and stop band effects within the two waveguides and, therefore, establish microwave filter characteristics.

Since the signal and pump energies are propagated in the dominant mode, the electric field vectors are maximized at the leads 23 and 26, respectively, and electromagnetic coupling of the energies ocurs across the nonlinear reactance elements 16. Because of the higher value of power of the pump energy this coupling results in the reactance of the nonlinear elements 16 being varied at the rate of the frequency of the pump energy and, because of the nonlinear reactance, a portion of the pump energy is translated to enhance the signal energy at the frequency, $f_s$, while another portion is translated to provide an idler energy at a frequency, $f_i$, which is the difference between the pump and signal frequencies, $f_p-f_s$. For amplification to occur this idler energy at the frequency, $f_i$, must develop and be supported, at least in the region of the nonlinear reactance elements 16. In the combination of FIG. 1, the propagation of idler frequency energy is supported by the signal circuit; that is, by the first section of waveguide 11.

As it propagates through the second waveguide 12 and a portion of the pump energy is successively coupled to each of the nonlinear reactance elements 16, the magnitude of the pump wave may progressively decrease. In order to correct for the deterioration of the pump energy, the successive elements 16 may be selected to have different reactance vs. voltage characteristics for suitable compensation, e.g., by employing diodes having less shunt capacitance toward the output end of the amplifier. Also, the same result may be achieved by biasing the successive elements 16 by different amounts, e.g., by decreasing the magnitude of the bias applied to the respective elements 16 toward the output end of the amplifier. In addition, certain parameters of the pump waveguide circuit (for example, the height of the waveguide 12 or the diameter of the supporting leads 26) may be varied among the successive elements 16 to achieve a higher concentration of the pump energy toward the output end of the amplifier. Moreover, the amount of energy coupling to the elements 16 may be adjusted by means of the stubs 17 and 20. In these instances the admittances of the elements 16 are made substantially the same for each of the successively disposed elements.

In the general application of the foregoing structural combination, the distance between successive nonlinear reactance elements 16 and the value of the admittance of the individual elements, as periodically mounted between the two waveguides 11 and 12, are fixed parameters of the system. Thus to obtain a required value of gain, band width and frequency range, it is generally necessary to alter the phase shift between successive nonlinear reactance elements of the energy in at least one of the waveguides. To meet such requirement a phase relationship between the pump, signal, and idler energies is established to provide substantially the same relationship as exists for the frequencies of these respective energies, as set forth in the foregoing; i.e., the phase shift of the pump energy between successive nonlinear reactance elements is substantially equal to the sum of the phase shift of the signal energy between the successive nonlinear reactance elements and the phase shift of the idler energy between the successive nonlinear reactance elements. Thus, in accordance with the present invention, such phase relationship of the cascade amplifier sections may be respectively established by periodic loading means 36, such as screws or irises, suitably inserted in at least one of the two waveguides 11 and 12 between the nonlinear reactance elements 16. Such loading means 36 is illustrated schematically in FIGS. 1 and 2 of the drawings as a pair of fixed-position inductance plates 37 and 38 mounted transversely within the pump waveguide 12. Where the respective frequencies of the energies are variable to provide flexibility of operation, the loading means 36 may be adjustable in a manner well-known in the microwave art so that operation at different combinations of the respective frequencies is achieved. Also, adjustability of the individual loading means 36 permits independent control of the phase relationship in the region of each of the elements 16. As indicated previously the periodic loading means 36 may be included in the signal-idler waveguide 11, as well as in the pump waveguide 12, or in both waveguides.

Thus, in accordance with the foregoing, the signal and pump energies are propagated through the respective waveguides 11 and 12 to couple to the nonlinear reactance elements 16 and, thereby, amplify the signal energy, the gain at each of the elements being adjustable by means of the loading means 36. The energies at the signal and idler frequencies are beyond cutoff with respect to the pump waveguide 12 so that the transmission characteristics of the loaded signal-idler waveguide 11 uniquely determines the phase shift for the signal and idler energies, respectively. Also, it is to be noted that the pump frequency is selected to fall within a stop band of the signal-idler waveguide circuit to prevent interference with such circuit. The amplified signal is then available at an output port 41 of signal waveguide 11 and any unused pump energy propagates to an output port 42 of pump waveguide 12. Suitable energy absorption structure may be coupled to the pump output port 42 in impedance matching relationship to prevent reflections and, thereby, instability of operation by effectively removing excess pump energy from the amplifier.

To avoid any tendency of the amplifier to oscillate, subsequent components coupled to the signal output port 41 are suitably impedance matched.

Figure 3:
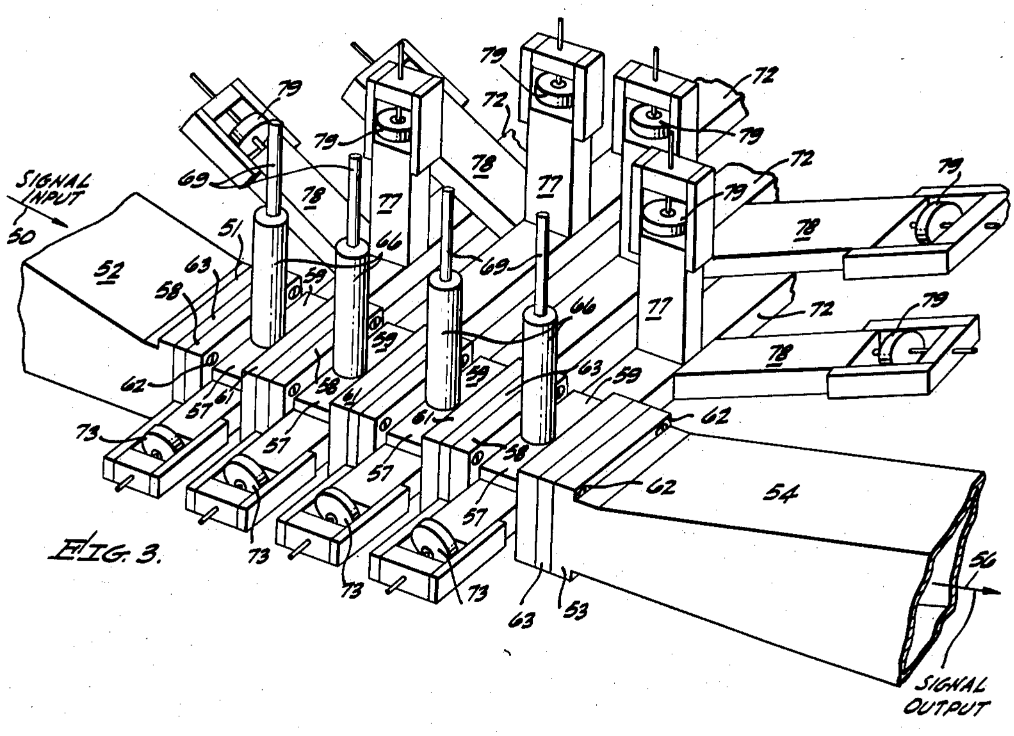
FIGURE 3 is a perspective view of a second form of the present invention.

A second form of the present invention is illustrated in the perspective view of FIG. 3 and in this figure energy at a signal frequency, $f_s$, is propagated from an input (see arrow 50) standard size waveguiding structure (not shown) to a reduced height waveguide coupling flange 51 by a section of tapered waveguide 52, which provides impedance matching between the two sizes of waveguiding structure. Output signal energy is similarly propagated from a reduced height waveguide coupling flange 53 to standard size waveguide (not shown) by a tapered section of waveguide 54 in the direction indicated by arrow 56. A plurality of cascade amplifier sections 57 is extended between the two reduced height waveguide couplers 51 and 53, respectively, and are shown as four in number by way of example in FIG. 3. For convenience of assembly each of the amplifier sections 57 is provided with a first coupling flange 58, a length of reduced height waveguide 59, and a second coupling flange 61. When the coupling flanges 58 and 61 of adjacent amplifier sections 57 are respectively joined together, as by screws 62, and to the two coupling flanges 51 and 53 of the tapered waveguides 52 and 54, to provide a continuous path for the signal energy, an iris element 63 is included between each pair of adjacent flanges.

Figure 4:
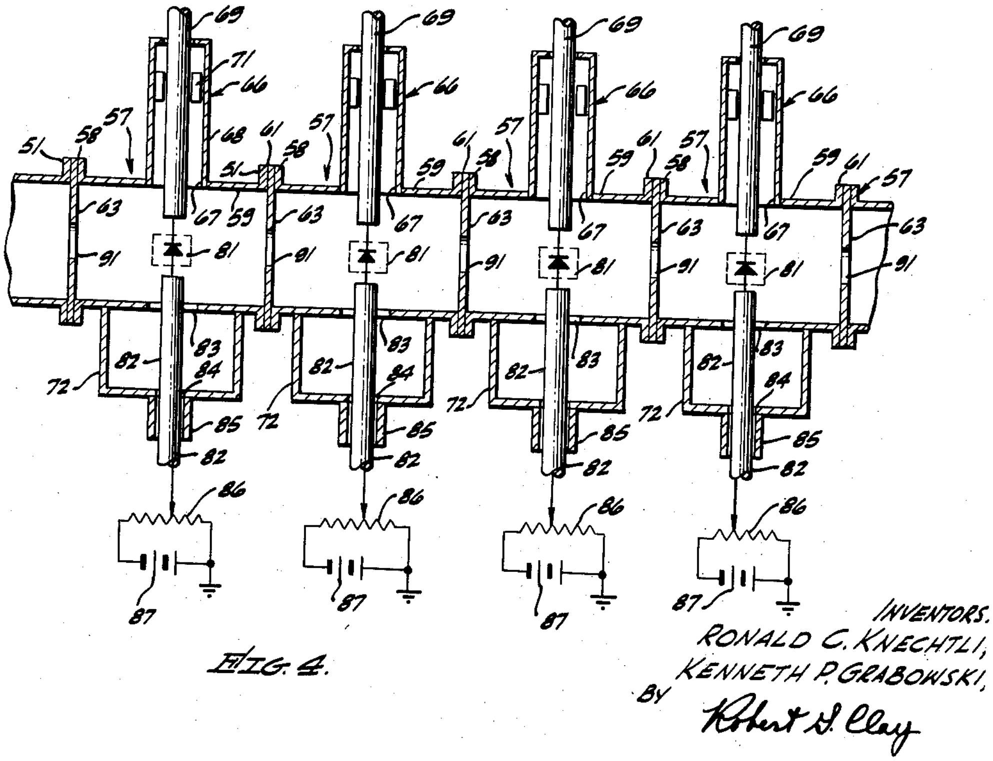
FIGURE 4 is a schematic elevational view, in cross section of a portion of the invention shown in FIG. 3.

In addition to the foregoing, each of the amplifier sections 57 is provided with a coaxial tuning stub 66 mounted transversely with respect to a broad wall of the reduced height waveguide 59 and communicating with the waveguide through suitable apertures 67 (shown in FIG. 4). The stubs 66 have an outer conductor 68, an inner conductor 69, and a variable short-circuiting plug 71 for both direct and radio frequency currents. The operational function of the stubs 66 will be set forth hereinafter.

To propagate energy at a required pump frequency, $f_p$, separate waveguides 72 are disposed transversely with respect to each of the amplifier sections 57 and have mutual contacting broad wall portions. One end of each of the waveguides 72 is terminated in a variable short circuiting plunger (not shown), in a manner well-known in the microwave art, which is controllable by a suitably mounted adjustment screw 73. The other ends of the waveguides 72 are extended to couple to a source of pump energy 74, as will be explained later in connection with FIG. 5, and include double-stub waveguide tuners for establishing resonant waveguide cavities in the region of the amplifier sections 57. Each of the double-stub tuners conventionally includes an E-plane stub 77 mounted transversely with respect to a broad wall of the pump waveguide 72 and an H-plane stub 78 mounted obliquely (for convenience of construction) from a narrow wall of such waveguide. Both the E-plane stubs 77 and the H-plane stubs 78 include variable short-circuiting plungers (not shown) with suitably mounted adjustable screws 79 associated therewith.

Referring now to the schematic cross section of the invention of FIG. 3, as shown in FIG. 4, a nonlinear reactance element 81 is connected at one end to the inner conductor 69 and at the other end to a similar conductor 82, which extends through a suitable aperture 83 between the two waveguides 59 and 72, through pump waveguide 72, and through an opening 84 in the opposing wall of the pump waveguide. At the emergence of the conductor 82 from the pump waveguide 72, a noncontacting conducting cylinder 85 operating as a wavetrap is extended about the conductor for a distance to reflect a low value of impedance at the pump frequency back to the waveguide in the well-known manner and thereby prevent loss of pump energy by leakage, while still permitting the passage of direct current. This latter provision is required for those instances where a bias is needed for suitable amplification by the nonlinear reactance elements 81, which may be applied in a conventional manner, as by connecting the conductor 82 to the adjustable element of a potentiometer 86, as connected across a source of direct current 87. Thus, as signal energy propagates through coupling apertures 91 of the irises 63 of the signal waveguides 59, the position of the nonlinear reactance elements 81 is readily adjustable.

Figure 5:
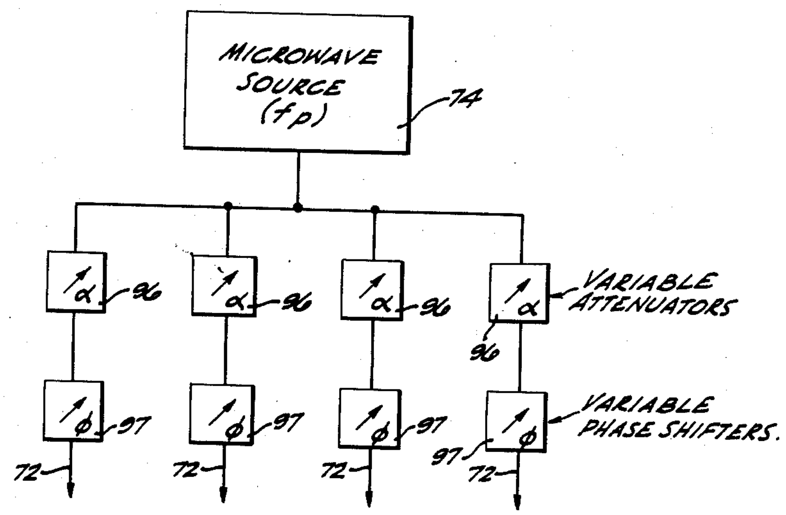
FIG. 5 is a schematic diagram of the pump energy feed system for the invention of FIG. 3.

As stated previously the pump waveguides 72 are coupled to a microwave source 74 of pump energy and this is illustrated schematically in FIG. 5. Thus, the source 74 of pump energy is common to each of the amplifier sections 57 and the energy thereof is divided into a plurality of branches (four in the present example) with each branch including a variable attenuator 96 and a variable phase shifter 97 prior to connection to the respective waveguides 72. The inclusion of the attenuators 96 and phase shifters 97 permits separate adjustment of the amplitude and phase of the pump energy as applied to each of the amplifier sections 57.

Consider now the operation of the traveling wave parametric amplifier as structurally described in the foregoing paragraphs. Energy at the signal frequency, $f_s$, is applied in the dominant mode at the input port of waveguide 52 in the direction of the arrow 50 and encounters a series of cavities established by the transversely mounted irises 63 as coupled together by the apertures 91. Each of the cavities is respectively loaded by the nonlinear reactance elements 81, which may be junction type semiconductor diodes having a nonlinear capacitance characteristic, and these elements then become an integral part of the cavities to automatically match to the propagating circuit provided by the afore-mentioned successive coupling of such loaded cavities. Coupling of energy between the signal-idler waveguide 59 and the pump waveguides 72, and vice versa is prevented in the same manner as set forth for the previously described amplifier.

With respect to microwave cavities in general, it is to be noted that highly concentrated electric field capabilities are inherent and that, when a number of cavities are suitably coupled together through inductive or capacitive irises, a propagating structure is provided with the usual alternation of filter-type pass bands and stop bands. Also, it is to be noted that the dimensions of the coupling apertures 91 of the irises 63 determine the size and shape of the pass band and, while such apertures have been illustrated as fixed in size, they may be made adjustable in a conventional manner. Now, with respect to the particular structure described, the resulting pass band has the characteristic that the width thereof is proportional to the strength of the coupling between successive cavity structures, while the concentration of the electric field is inversely proportional to such coupling. Thus, for an amplifier having a particular bandwidth, the iterative propagating structure is assembled having suitable dimensions to provide such bandwidth and the highest possible concentration of electric field consistent with this selected bandwidth.

The signal energy has been introduced to the propagating structure, as set forth above, in the dominant mode and excites a cavity mode having the highest concentration of electric field centrally within the respective cavities. Since the nonlinear reactance elements 81 are mounted centrally within the respective cavities, the elements are in line with the highest concentration of electric field. Now, to maximize the coupling between the nonlinear reactance elements 81 and the electric field of the signal energy in the cavity, the adjustable short 71 of the coaxial stub 66 is adjusted so that the admittance of the combination is substantially equivalent to that of a series resonant circuit.

In addition to the signal energy, energy at a pump frequency, $f_p$, is supplied by the microwave source 74 to each of the pump waveguides 72, which are terminated in a short circuit made adjustable by screws 73. In combination with the short circuit the two stub tuners 77 and 78 are adjusted to establish a resonant waveguide cavity therebetween in the region of the conductor 82. Here again the energy of the cavity is in a mode having the highest concentration of electric field at the center of the cavity and thus at the conductor 82 so that electromagnetic coupling is maximized. The vertical location of the nonlinear element may be varied to obtain optimum mixing of the pump and signal energies.

With the energy at both the signal and pump frequencies coupled to appear across the nonlinear reactance elements 81, the reactance of such elements is varied in a nonlinear manner at the rate of the pump frequency, $f_p$, and a portion thereof is translated to a component at the signal frequency, $f_s$, to enhance the signal energy while another portion thereof is translated to an energy component at an idler frequency, $f_i$, equal to the difference between the pump and signal frequencies ($f_i=f_p-f_s$).

In addition to the foregoing criteria for amplification of the signal energy, it is necessary that the phase shift of the pump, signal, and idler energies have substantially the same relationship as that set forth for the respective frequencies. Thus, for the range of frequencies where the frequency and phase relationships are both substantially met, amplification occurs. To establish the foregoing required phase relationship, the phase shifters 97 may be readily adjusted independently or the bias of the non-linear elements 81 varied by means of the potentiometers 86. The amplified signal energy then propagates out the tapered waveguide 54 in the direction indicated by the arrow 56 and is available for application to subsequent circuit components (now shown).

It has been shown that the amplifiers of FIG. 1 and FIG. 3 are operable when the frequency and phase relationships are substantially the same and correspond to $f_p=f_s+f_i$ and $\phi_p\cong\phi_s+\phi_i$, respectively, where $\phi_p$, $\phi_s$, and $\phi_i$ are the phase shifts between successive elements 81 for the pump energy, the signal energy, and the idler energy, respectively. Both such amplifiers are capable of operation about various frequencies within the established pass band and for an understanding thereof reference is made to FIG. 6, wherein a curve 101 illustrates the relationship between frequency and phase for the iterative propagating structures of the amplifiers. As an example of operation for maximum bandwidth the frequency and phase of the pump energy are established such that one-half of the values of the pump frequency and pump phase coincide with a point of inflection 102 (where the deriative of the slope of the curve changes sign) on the frequency versus phase curve 101. The signal and idler energies then propagate symmetrically about the point of inflection as illustrated by points 103 and 104, respectively.

Figure 6:
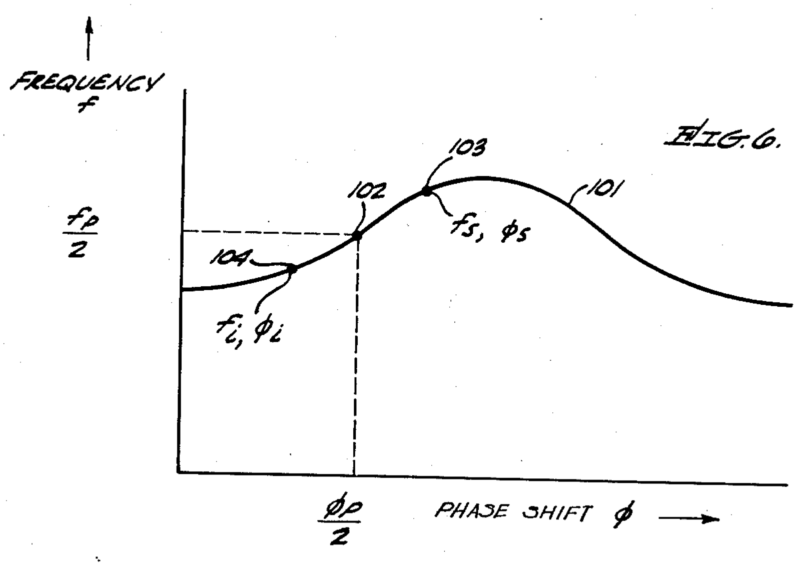
FIGURE 6 is a characteristic diagram illustrating operation of the invention shown in FIGS. 1 and 3.

Consider now the typical performance of an amplifier constructed in accordance with FIG. 3 and operated in the manner described in connection with FIG. 6. With such structure a 10 decibel gain from input to output has been obtained over a band of 325 megacycles per second with a center frequency of 3000 megacycles per second in four amplifier sections. The nonlinear reactance elements for this amplifier were junction type semiconductor diodes, HPA 2800, manufactured by the Hughes Aircraft Company of Culver City, California, and the total pump power was less than 300 milliwatts.

There has therefore been described in detail a traveling wave parametric amplifier for low noise signal amplification having the dual characteristics of wide bandwidth and large forward gain, which enables separation of the input and output without the necessity of a complex circulator. The invention has been described in particular for rectangular waveguide cavities, however, circular waveguide cavities may be readily used.

While the salient features of the present invention have been described in detail with respect to certain embodiments thereof, it will be readily apparent that numerous modifications may be made wihin the spirit and scope of the invention and it is not desired to limit the invention to the exact details shown and described except insofar as they may be set forth in the following claims.

We claim:

1. A microwave amplifier comprising a plurality of amplifier sections coupled in cascade, each section including a first waveguiding structure for propagating energy at a pump frequency, a second waveguiding structure for propagating energy at a signal frequency and at an idler frequency, said idler frequency being equal to the difference between said pump and signal frequencies, a device having a nonlinear reactance characteristic extended between said first and second waveguiding structures and coupled through openings therein to said energies at said pump and signal frequencies, and iris means projecting into at least one of said first and second waveguiding structures for establishing a phase relationship in which the phase shift of said pump energy between successive devices is substantially equal to the sum of the phase shift of said signal energy between said successive devices and the phase shift of said idler energy between said successive devices.

2. A microwave amplifier comprising a first waveguiding structure for propagating energy at a signal frequency, a plurality of devices having a nonlinear capacitance characteristic mounted in spaced-apart relation in a longitudinal center plane of said first waveguiding structure to couple to said energy at said signal frequency, a second waveguiding structure disposed adjacent and parallel to said first waveguiding structure for propagating energy at a pump frequency and for applying said pump energy to each of said plurality of devices whereby the capacitance of said devices is varied at the rate of said pump frequency with a portion of said pump energy being translated to enhance said energy at said signal frequency and another portion being translated to establish an energy at an idler frequency, said idler frequency being equal to the difference between said pump and signal frequencies, said first waveguiding structure supporting the propagation of said energy at said idler frequency, and iris means projecting into at least one of said first and second waveguiding structures between successive devices for establishing a phase relationship in which the phase shift of said pump energy between successive devices is substantially equal to the sum of the phase shift of said signal energy between said successive devices and the phase shift of said idler energy between said successive devices.

3. A microwave amplifier according to claim 2 wherein said iris means is a plurality of irises mounted in said second waveguiding structure and extended transversely with respect to said longitudinal center plane, each iris being provided with a coupling aperture of establish an electrically loaded propagating structure.

4. In a microwave amplifier, the combination comprising a first waveguide for propagating signal energy and having periodic electric loading means to provide a series of resonant sections electromagnetically coupled through said loading means, a nonlinear reactance element mounted in each of said sections to electromagnetically couple to said signal energy, and a plurality of second waveguides for propagating pump energy with one disposed adjacent said first waveguide at each of said sections and electromagnetically coupled to said elements whereby the reactance of said elements is varied at the rate of said pump energy to translate a portion of said pump energy to enhance said signal energy and another portion to establish an idler energy, the frequency of said idler energy being equal to the difference between the frequencies of said pump and signal energies and means coupled to each of said second waveguides for establishing a phase relationship in which the phase shift of said pump energy between successive nonlinear reactance elements is substantially equal to the sum of the phase shift of said signal energy between said successive nonlinear reactance elements and the phase shift of said idler energy between said successive nonlinear reactance elements.

5. The combination of claim 4 wherein said means for establishing a phase relationship comprises a separate variable phase shifter coupled between a single source of pump energy and each of said second waveguides for individually adjusting the phase of the pump energy as coupled to each of said nonlinear reactance elements.

6. The combination of claim 4 wherein said nonlinear reactance elements are supported in said sections by adjustable mounting means for varying the location of said elements in said sections, thereby varying the electromagnetic coupling to said signal and pump energies to optimize the mixing thereof.

7. In a microwave amplifier, the combination comprising a first waveguide for propagating signal energy and having periodic loading means to provide a series of resonant sections electromagnetically coupled through said loading means, a semiconductor diode mounted in each of said sections and electromagnetically coupled to said signal energy, each said diode having a nonlinear capacitance characteristic with variation in voltage, a plurality of second waveguides for propagating pump energy, each disposed adjacent said first waveguide at one of said sections and electromagnetically coupled to the diode therein, whereby the capacitance of said diode is varied at the rate of said pump energy to translate a portion of said pump energy to enhance said signal energy and to translate another portion to establish an idler energy, the frequency of said idler energy being equal to the difference between the frequencies of said pump and signal energies, means coupled to each of said second waveguides for establishing a phase relationship in which the phase shift of said pump energy between successive diodes is substantially equal to the sum of the phase shift of said signal energy between said successive diodes and the phase shift of said idler energy between said successive diodes, and separate bias means connected across each of said diodes to establish a range of capacitance over which said diodes operate.

References Cited in the file of this patent

UNITED STATES PATENTS

| | | |
|---|---|---|
| 2,815,488 | Von Neumann | Dec. 3, 1957 |
| 2,825,765 | Marie | Mar. 4, 1958 |
| 2,936,369 | Lader | May 10, 1960 |
| 2,970,275 | Kurzrok | Jan. 31, 1961 |
| 2,978,649 | Weiss | Apr. 4, 1961 |
| 3,012,203 | Tien | Dec. 5, 1961 |

OTHER REFERENCES

Heffner et al.: "Proceedings of the IRE," June 1958, page 1301.

Weber: "Electronics" (engineering issue), September 26, 1958, pages 65–71.

Tien et al.: "Proceedings of the IRE," April 1958, pages 700–706.

Uhlir: "Scientific American," June 1959, pages 118–120, 123, 124, 126, 127, and 129.

Currie et al.: "Proceedings of the IRE," December 1960, pages 1960–1987.